(12) United States Patent
Zhu et al.

(10) Patent No.: US 10,762,976 B2
(45) Date of Patent: Sep. 1, 2020

(54) SCAN DRIVING CIRCUIT, DRIVING METHOD, AND DISPLAY DEVICE

(71) Applicant: Shanghai Tianma AM-OLED Co., Ltd., Shanghai (CN)

(72) Inventors: Renyuan Zhu, Shanghai (CN); Yue Li, Shanghai (CN); Dongxu Xiang, Shanghai (CN); Yana Gao, Shanghai (CN); Xingyao Zhou, Shanghai (CN); Gaojun Huang, Shanghai (CN); Yilin Xu, Shanghai (CN); Zhonglan Cai, Shanghai (CN); Juan Zhu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 170 days.

(21) Appl. No.: 16/197,521

(22) Filed: Nov. 21, 2018

(65) Prior Publication Data

US 2019/0333596 A1   Oct. 31, 2019

(30) Foreign Application Priority Data

Apr. 28, 2018   (CN) .......................... 2018 1 0398285

(51) Int. Cl.
*G11C 19/00* (2006.01)
*G11C 19/28* (2006.01)
*G09G 3/3266* (2016.01)

(52) U.S. Cl.
CPC ......... *G11C 19/287* (2013.01); *G09G 3/3266* (2013.01); *G09G 2300/0426* (2013.01); *G09G 2310/0286* (2013.01); *G09G 2310/08* (2013.01); *G09G 2330/04* (2013.01); *G11C 19/28* (2013.01)

(58) Field of Classification Search
None
See application file for complete search history.

(56) References Cited

U.S. PATENT DOCUMENTS

| | | | |
|---|---|---|---|
| 9,881,543 B2 * | 1/2018 | Ma .......................... | G11C 19/28 |
| 10,497,454 B2 * | 12/2019 | Ma ............................ | G09G 3/36 |
| 2014/0078029 A1 * | 3/2014 | Jang .......................... | G09G 3/32 345/82 |
| 2016/0189626 A1 * | 6/2016 | Sun ....................... | G09G 3/3225 345/212 |
| 2017/0287404 A1 * | 10/2017 | Kim ..................... | G09G 3/3266 |

(Continued)

FOREIGN PATENT DOCUMENTS

CN   106486065 A   3/2017

*Primary Examiner* — Tuan T Lam
(74) *Attorney, Agent, or Firm* — Tarolli, Sundheim, Covell & Tummino LLP

(57) ABSTRACT

The present disclosure provides a shift register. The shift register includes: a first node control module for controlling level at the first node; a second node control module for controlling level at a second node; and an output control module for controlling the output terminal to output high or low level. The first node control module includes an input unit configured to write the input signal into the third node and a protection unit configured to control a level at a fourth node based on a level at the third node and control writing of the level at the fourth node into the first node based on the second clock signal. The technical solution of the present disclosure can prevent the transistor for providing the third node with inputting signal from being broken down.

20 Claims, 7 Drawing Sheets

(56) References Cited

U.S. PATENT DOCUMENTS

| | | | |
|---|---|---|---|
| 2017/0287413 A1* | 10/2017 | Li | G09G 3/3426 |
| 2017/0294166 A1* | 10/2017 | Kim | G11C 19/28 |
| 2018/0091151 A1* | 3/2018 | Zheng | H03K 19/096 |
| 2019/0311669 A1* | 10/2019 | Zhu | G09G 3/2092 |
| 2019/0347996 A1* | 11/2019 | Zhu | G11C 19/28 |
| 2019/0355317 A1* | 11/2019 | Wang | G09G 3/3677 |
| 2020/0013473 A1* | 1/2020 | Xuan | G09G 3/3677 |
| 2020/0020291 A1* | 1/2020 | Huang | G09G 3/3266 |

\* cited by examiner

SCAN DRIVING CIRCUIT, DRIVING METHOD, AND DISPLAY DEVICE

CROSS-REFERENCE TO RELATED APPLICATIONS

The present application claims priority to Chinese Patent Application No. 201810398285.7, filed on Apr. 28, 2018, the content of which is incorporated herein by reference in its entirety.

TECHNICAL FIELD

The present disclosure relates to display technology, and more particularly, to a scan driving circuit, a method for driving a shift register, and a display device.

BACKGROUND

With the rapid development of the flat panel display technology, an Organic Light Emitting Display (OLED for short) has been widely applied due to its excellent characteristics such as self-luminescence, high brightness, wide viewing angle, and rapid response. In order to drive organic light emitting devices in an OLED to emit light, an OLED panel includes a scan driving circuit containing a plurality of cascaded shift registers.

A circuit structure of a shift register in the related art and its corresponding operating sequence are shown in FIG. 1 and FIG. 2, respectively. FIG. 1 is a circuit structure diagram of a shift register provided in the related art and FIG. 2 is an operating sequence diagram of the shift register provided in the related art. It has been found that there is a risk of breakdown of the transistor M1 in the shift register due to high voltage drop between its first terminal and second terminal.

SUMMARY

The present disclosure provides a scan driving circuit, a driving method of a shift register, and a display device, which can prevent a transistor that provides an input signal to a third node from breakdown.

In a first aspect of the present disclosure, a scan driving circuit including a plurality of cascaded shift registers is provided. A shift register at each stage of the plurality of cascaded shift registers includes a first node control module, a second node control module and an output control module. The first node control module is electrically connected to an input signal terminal, a first clock signal terminal, a second clock signal terminal, a high level signal terminal, a first node, a second node and a third node, and configured to control a level at the first node based on respective levels of an input signal, a first clock signal, a second clock signal, a high level signal and the second node. The first node control module includes an input unit configured to write the input signal into the third node and a protection unit configured to control a level at a fourth node based on a level at the third node and control writing of the level at the fourth node into the first node based on the second clock signal. The second node control module is electrically connected to the first clock signal terminal, a low level signal terminal and the second node, and configured to control the level at the second node based on the first clock signal and the low level signal. The output control module is electrically connected to the first node, the second node, the high level signal terminal, the second clock signal terminal and a scan signal output terminal, and configured to control the scan signal output terminal to output a high level or a low level based on the level at the first node and the level at the second node.

In a second aspect of the present disclosure, a display device is provided. The display device includes the scan driving circuit according to the first aspect.

In a third aspect of the present disclosure, a method for driving a shift register of the scan driving circuit according to the first aspect. The method includes:

maintaining, by the first node control module, the first node at a high level of a previous phase; providing, by the second node control module, a low level at the second node; and controlling, by the output control module, the scan signal output terminal to output a high level, in a first phase when the input signal provided by the input signal terminal is at a low level, the first clock signal provided by the first clock signal terminal is at a low level and the second clock signal provided by the second clock signal terminal is at a high level;

providing, by the first node control module, a low level at the first node; providing, by the second node control module, a high level at the second node; and controlling, by the output control module, the scan signal output terminal to output a low level, in a second phase when the input signal provided by the input signal terminal is at a high level, the first clock signal provided by the first clock signal terminal is at a high level, and the second clock signal provided by the second clock signal terminal is at a low level;

maintaining, by the first node control module, the first node at the low level of the second phase; providing, by the second node control module, a low level at the second node; and controlling, by the output control module, the scan signal output terminal to output a high level, in a third phase when the input signal provided by the input signal terminal is at a high level, the first clock signal provided by the first clock signal terminal is at a low level, and the second clock signal provided by the second clock signal terminal is at a high level; and providing, by the first node control module, a high level at the first node; maintaining, by the second node control module, the second node at the low level of the third phase; and controlling, by the output control module, the scan signal output terminal to output a high level, in a fourth phase when the input signal provided by the input signal terminal is at a high level, the first clock signal provided by the first clock signal terminal is at a high level, and the second clock signal provided by the second clock signal terminal is at a low level.

BRIEF DESCRIPTION OF DRAWINGS

In order to illustrate technical solutions of embodiments of the present disclosure, the accompanying drawings used in the embodiments are described below. The drawings described below are a part of the embodiments of the present disclosure. Based on these drawings, those skilled in the art can obtain other drawings without any creative effort.

DESCRIPTION OF EMBODIMENTS

In order to better understand technical solutions of the present disclosure, the embodiments of the present disclosure are described in details with reference to the drawings. It should be clear that the described embodiments are merely part of the embodiments of the present disclosure rather than all of the embodiments. All other embodiments obtained by those skilled in the art without paying creative labor shall fall into the protection scope of the present disclosure.

Figure 1:
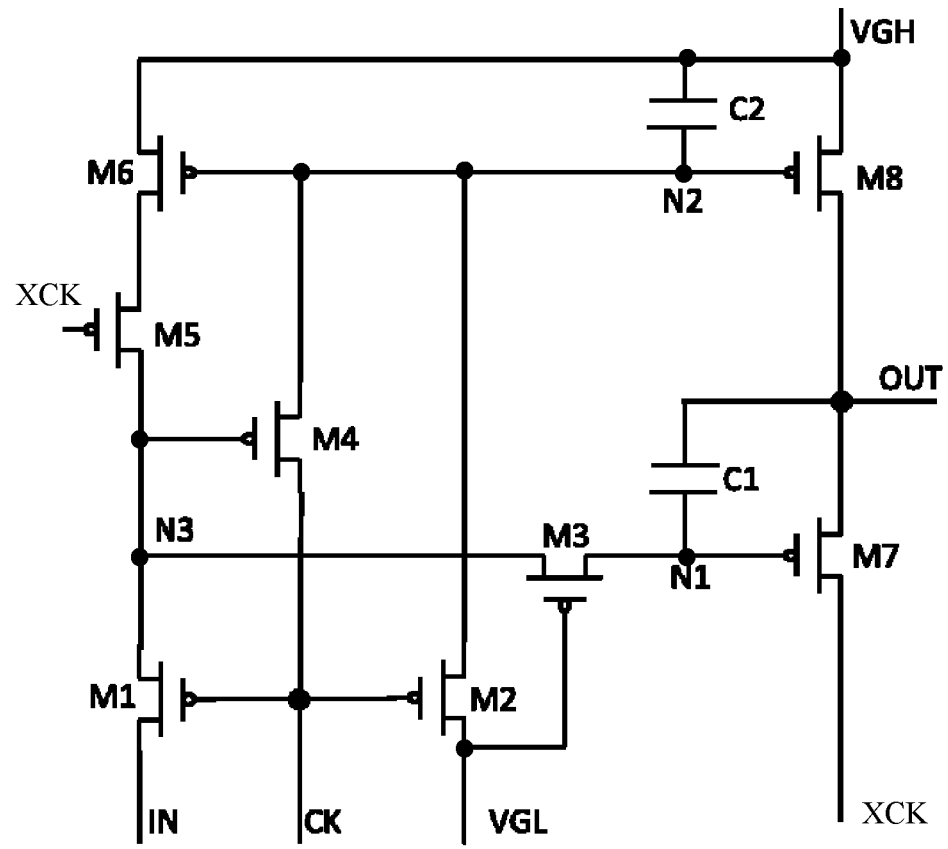
FIG. 1 is a circuit structure diagram of a shift register provided in the prior art.

A shift register provided in the related art, as shown in FIG. 1, includes eight transistors M1-M8, two capacitors C1-C2. The transistors and capacitors are electrically connected in a layout as shown in FIG. 1. Each of the transistors is a PMOS transistor, which is switched on when its control terminal is at a low level and is switched off when its control terminal is at a high level. The transistor M3 has a control terminal electrically connected to a low level signal input terminal VGL. The transistor M3 is an always-on transistor, i.e., the transistor M3 is always switched on.

Figure 2:
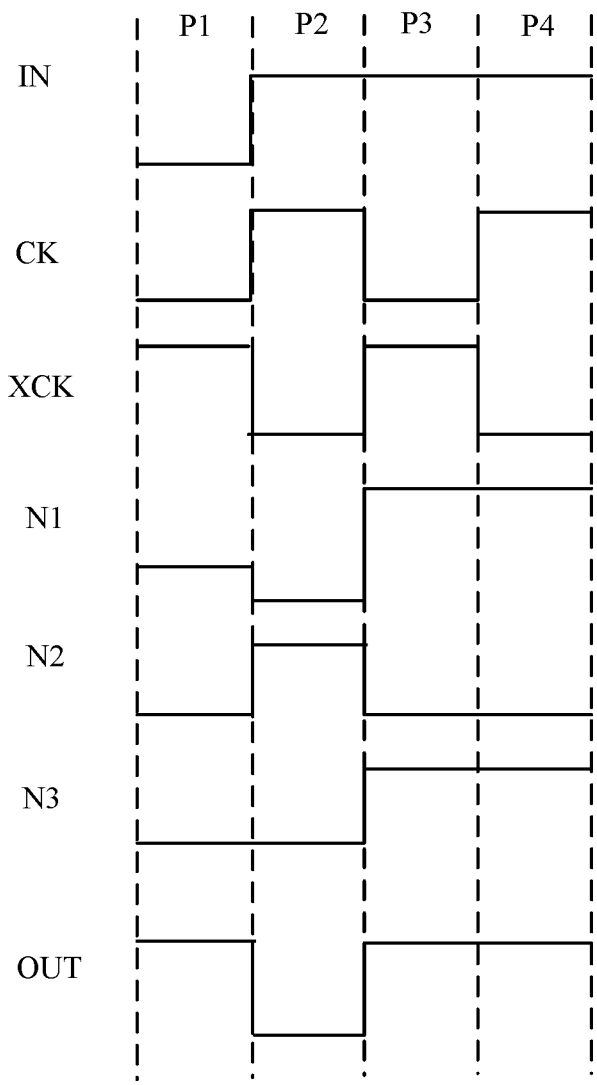
FIG. 2 is an operating sequence diagram of the shift register provided in the related art.

As shown in FIG. 2, an operating sequence of the shift register includes the following phases.

In phase P1, an input signal provided by an input signal terminal IN is at a low level, a first clock signal provided by a first clock signal terminal CK is at a low level, and a second clock signal provided by a second clock signal terminal XCK is at a high level. The transistor M1 and the transistor M2 controlled by the first clock signal are switched on. The input signal arrives at a node N3 through the transistor M1, and the node N3 is then at a low level. The low level at the node N3 arrives at the node N1 through the transistor M3, and the node N1 is then at a low level. The low level at the node N3 switches the transistor M4 on. The first clock signal arrives at the node N2 through the transistor M4. The low level signal arrives at the node N2 through the transistor M2, and the node N2 is then at a low level. The transistor M6 is switched on. The transistor M5 under control of the second clock signal is switched off. The low level at the node N1 switches the transistor M7 on. The low level at the node N2 switches the transistor M8 on. The scan signal output terminal OUT outputs the high level of the second clock signal and the high level of the high level signal.

In phase P2, the input signal provided by the input signal terminal IN is at a high level, the first clock signal provided by the first clock signal terminal CK is at a high level, and the second clock signal provided by the second clock signal terminal XCK is at a low level. The transistor M1 and the transistor M2 controlled by the first clock signal is switched off. The capacitor C1 maintains the node N1 at the low level of the phase P1. The low level at the node N1 arrives at the node N3 through the transistor M3, and the node N3 is then at a low level. The transistor M4 is switched on. The first clock signal arrives at the node N2 through the transistor M4, and the node N2 is then at a high level. The transistor M6 is switched off. The transistor M5 controlled by the second clock signal is switched on. The low level at the node N1 switches the transistor M7 on. The high level at the node N2 switches the transistor M8 off. The scan signal output terminal OUT outputs the low level of the second clock signal. The scan signal output terminal OUT can further pull down the low level at the node N1 under a coupling effect of the capacitor C1.

In phase P3, the input signal provided by the input signal terminal IN is at a high level, the first clock signal provided by the first clock signal terminal CK is at a low level, and the second clock signal provided by the second clock signal terminal XCK is at a high level. The transistor M1 and the transistor M2 controlled by the first clock signal are switched on. The input signal arrives at the node N3 through the transistor M1, and the node N3 is then at a high level. The transistor M4 is switched off. The high level at the node N3 arrives at the node N1 through the transistor M3, and the node N1 is then at a high level. The low level signal arrives at the node N2 through the transistor M2, and the node N2 is then at a low level. The transistor M6 is switched on. The transistor M5 controlled by the second clock signal is switched off. The high level at the node N1 switches the transistor M7 off. The low level at the node N2 switches the transistor M8 on. The scan signal output terminal OUT outputs a high level of the high level signal.

In phase P4, the input signal provided by the input signal terminal IN is at a high level, the first clock signal provided by the first clock signal terminal CK is at a high level, and the second clock signal provided by the second clock signal terminal XCK is at a low level. The transistor M1 and the transistor M2 controlled by the first clock signal are switched off. The transistor M5 controlled by the second clock signal is switched on. The capacitor C2 maintains the node N2 at the low level in phase P3. The transistor M6 is switched on. The high level signal arrives at the node N3 through the transistor M6 and the transistor M5, and the node N3 is then at a high level. The transistor M4 is switched off. The high level at the node N3 arrives at the node N1 through the transistor M3, and the node N1 is then at a high level. The high level at the node N1 switches the transistor M7 off. The low level at the node N2 switches the transistor M8 on. The scan signal output terminal OUT outputs a high level of the high level signal.

It can be seen from above that, in the phase P2, the second clock signal at the low level is outputted from the scan signal output terminal OUT. Since the capacitor C1 has one electrode electrically connected to the scan signal output terminal OUT and the other electrode electrically connected to the node N1, with the coupling effect of the capacitor C1, the low level at the node N1 will be further pulled down, e.g., from about −5V in the phase P1 to about −20V in the phase P2. Since the transistor M3, which is an always-on PMOS transistor, is electrically connected between the node N3 and the node N1, the absolute value of the low level transmitted to the node N3 can be reduced. For example, assuming that the threshold voltage of the transistor M3 is −2V and the high level of the input signal is 8.00000V, when the low level at the node N1 is −20V in the phase P2, the low level is transmitted to the node N3 via the transistor M3 and the low level at the node N3 is −18V. In this case, a voltage drop between the first and second terminals of the transistor M1 is 26V. That is, even the transistor M3 is provided, the voltage drop between the first and second terminals of the transistor M1 is still too high in the phase P2 and thus the risk of breakdown of the transistor M1 is still high.

Figure 3:
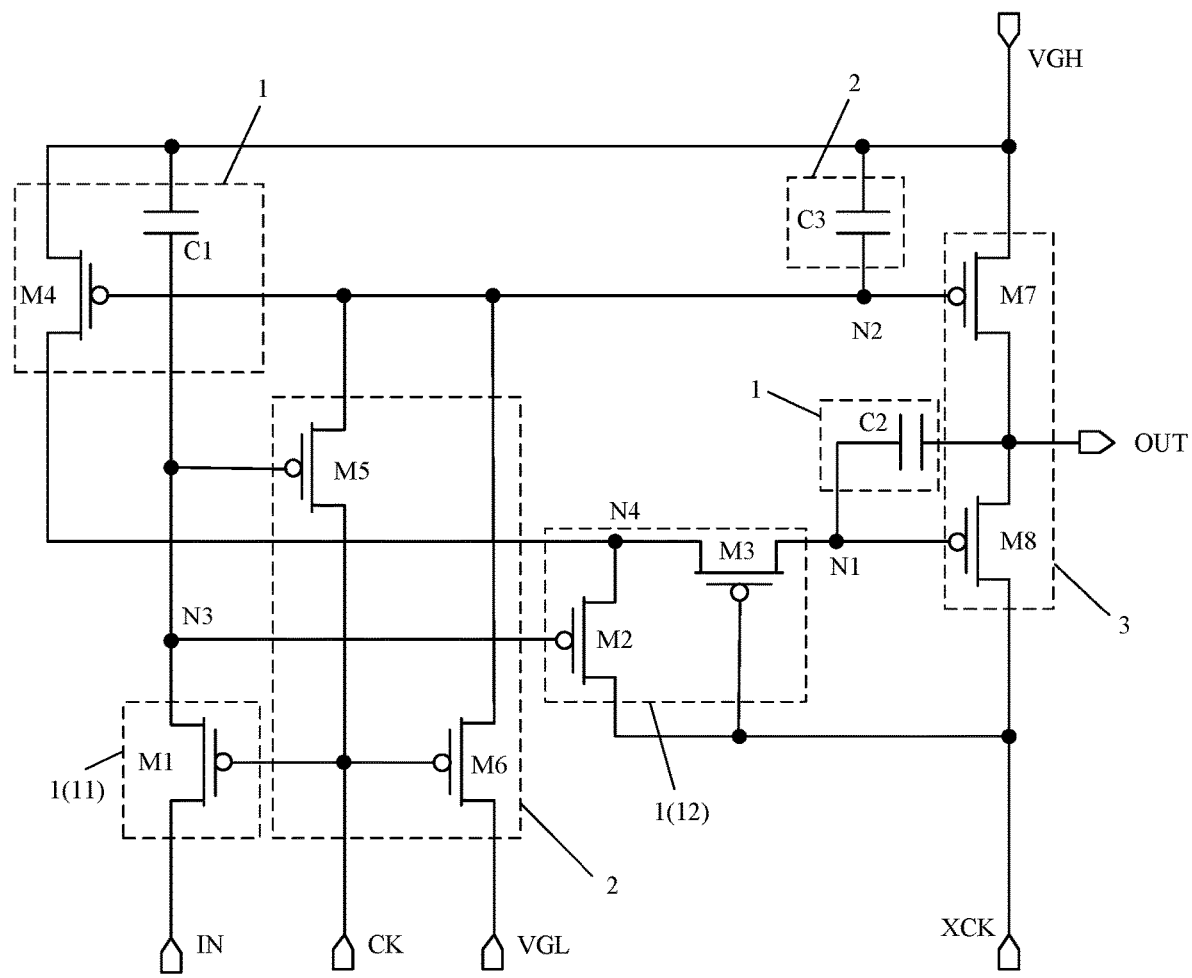
FIG. 3 is a circuit structure diagram of a shift register according to an embodiment of the present disclosure.
Figure 4:
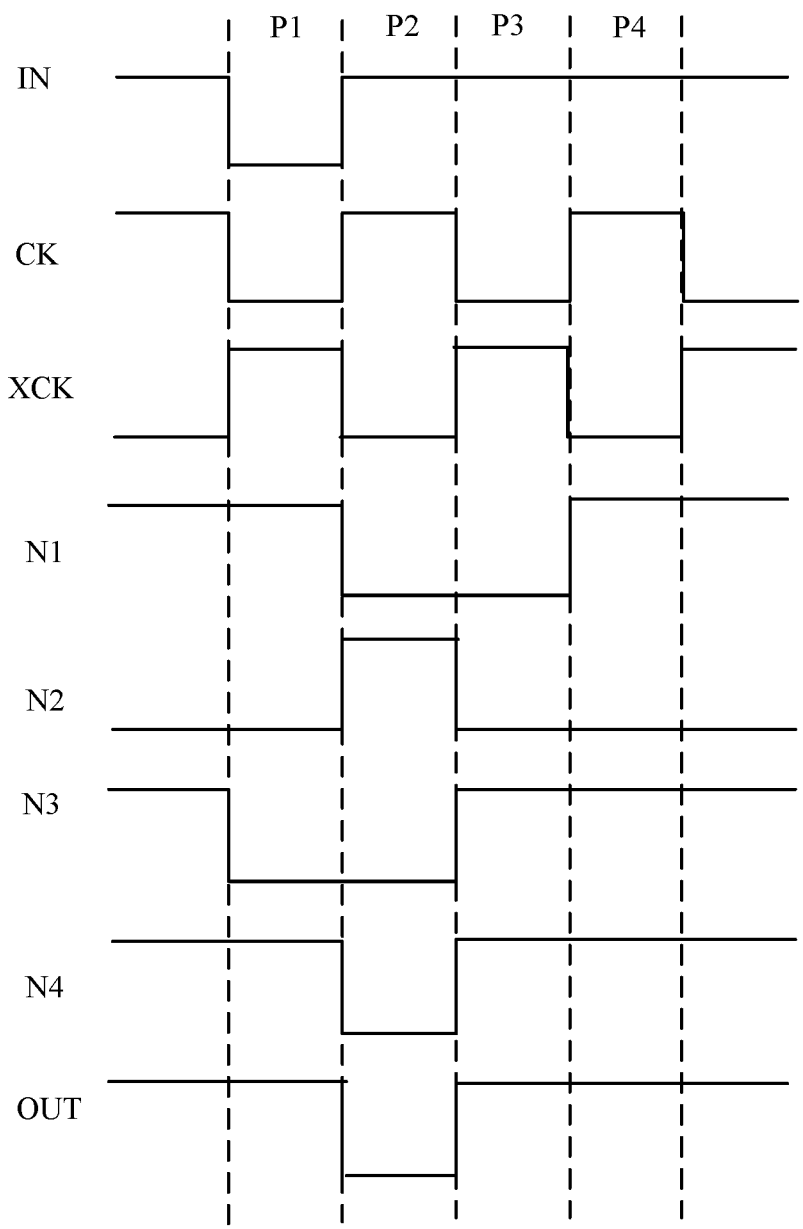
FIG. 4 is an operating sequence diagram of the shift register according to the embodiment of the present disclosure as shown in FIG. 3.

In order to solve the above problems in the related art, an embodiment of the present disclosure provides a shift register as shown in FIGS. 3 and 4. FIG. 3 is a circuit structure diagram of a shift register according to an embodiment of the present disclosure, and FIG. 4 is an operating sequence diagram of the shift register according to the embodiment of the present disclosure shown in FIG. 3. The shift register includes a first node control module 1, a second node control module 2 and an output control module 3.

The first node control module 1 is electrically connected to an input signal terminal IN, a first clock signal CK, a second clock signal terminal XCK, a high level signal terminal VGH, a first node N1, a second node N2 and a third node N3. The first node control module 1 is configured to control a level at the first node N1 based on respective levels of an input signal, a first clock signal, a second clock signal, a high level signal and a level at the second node N2. The first node control module 1 includes an input unit 11 and a protection unit 12. The input unit 11 is configured to write the input signal into the third node N3. The protection unit 12 is configured to control a level at a fourth node N4 based on a level at the third node N3 and control writing of the level at the fourth node N4 into the first node N1 based on the second clock signal.

The second node control module 2 is electrically connected to the first clock signal terminal CK, a low level signal terminal VGL and the second node N2. The second node control module 2 is configured to control a level at the second node N2 based on the first clock signal and the low level signal.

The output control module 3 is electrically connected to the first node N1, the second node N2, the high level signal terminal VGH, the second clock signal terminal XCK and a scan signal output terminal OUT. The output control module 3 is configured to control the scan signal output terminal OUT to output a high level or a low level based on the level at the first node N1 and the level at the second node N2.

Since the first node control module 1 includes an input unit 11 configured to write the input signal into the third node N3, and a protection unit 12 configured to control a level at the fourth node N4 based on a level at the third node N3 and control writing of the level at the fourth node N4 into the first node N1 based on the second clock signal, i.e., there is no direct signal transmission between the third node N3 and the first node N1. The third node N3 and the first node N1 mutually influence in such manner that the level at the third node N3 controls the level at the fourth node N4, which the fourth node N4 is electrically connected to the first node N1. Thus, when the level at the first node N1 is very low, it will not result in a such low level at the third node N3, so as to avoid an excessively high voltage drop between the first and second terminals of the transistor for providing the third node N3 with the input signal in the first node control module 1. In this way, the transistor is effectively protected from being broken down and the stability of the shift register in operation is significantly improved.

In an implementation, the first node control module 1 is specifically configured to: in a first phase P1, maintain the first node N1 at a high level of a previous phase based on the low level of the input signal, the low level of the first clock signal and the high level of the second clock signal; in a second phase P2, provide a low level at the first node N1 based on the high level of the input signal, the high level of the first clock signal and the low level of the second clock signal; in a third phase P3, maintain the first node N1 at the low level of the second phase P2 based on the high level of the input signal, the low level of the first clock signal and the high level of the second clock signal; and in a fourth phase P4, provide a high level at the first node N1 based on the high level of the input signal, the high level of the first clock signal and the low level of the second clock signal.

In an implementation, the second node control module 2 is specifically configured to: in the first phase P1, provide a low level at the second node N2 based on the low level of the input signal, the low level of the first clock signal and the high level of the second clock signal; in the second phase P2, provide a high level at the second node N2 based on the high level of the input signal, the high level of the first clock signal and the low level of the second clock signal; in the third phase P3, provide a low level at the second node N2 based on the high level of the input signal, the low level of the first clock signal and the high level of the second clock signal; and in the fourth phase P4, maintain the second node N2 at the low level of the third phase P3 based on the high level of the input signal, the high level of the first clock signal and the low level of the second clock signal.

In an implementation, the output control module 3 is specifically configured to: in the first phase P1, control the scan signal output terminal OUT to output a high level based on the high level at the first node N1, the low level at the second node N2 and the high level of the second clock signal; in the second phase P2, control the scan signal output terminal OUT to output a low level based on the low level at the first node N1, the high level at the second node N2 and the low level of the second clock signal; in the third phase P3, control the scan signal output terminal OUT to output a high level based on the low level at the first node N1, the low level at the second node N2 and the high level of the second clock signal; and in the fourth phase P4, control the scan signal output terminal OUT to output a high level based on the high level at the first node N1, the low level at the second node N2 and the low level of the second clock signal.

It should be noted that the high level signal terminal VGH necessarily provides a high level signal during the first phase P1 to the fourth phase P4, and the low level signal terminal VGL provide a low level signal during the first phase P1 to the fourth phase P4. In addition, the first clock signal and the second clock signal have a same frequency, there is no overlapping between their enable levels, and there may be overlapping or may be no overlapping between their non-enable levels. In the example as shown in FIGS. 3 and 4, the enable levels of the first clock signal and the second clock signal both are low levels, the non-enable levels of the first clock signal and the second clock signal both are high levels, and there is no overlapping between low levels of the first clock signal and the second clock signal and between high levels of the first clock signal and the second clock signal.

To assist those skilled in the art in understanding and achieving the beneficial effects of the above-mentioned shift register, an embodiment of the present disclosure provides a method for driving the shift register as shown in FIG. 3. Referring to FIG. 4, the method includes:

in a first phase P1 when the input signal provided by the input signal terminal IN is at a low level, the first clock signal provided by the first clock signal terminal CK is at a low level, and the second clock signal provided by the second clock signal terminal XCK is at a high level, maintaining, by the first node control module 1, the first node N1 at a high level of a previous phase; providing, by the second node control module 2, a low level at the second node N2; and controlling, by the output control module 3, the scan signal output terminal OUT to output a high level;

in a second phase P2 when the input signal provided by the input signal terminal IN is at a high level, the first clock signal provided by the first clock signal terminal CK is at a high level, and the second clock signal provided by the second clock signal terminal XCK is at a low level, providing, by the first node control module 1, a low level at the first node N1; providing, by the second node control module 2, a high level at the second node N2; and controlling, by the output control module 3, the scan signal output terminal OUT to output a low level;

in a third phase P3 when the input signal provided by the input signal terminal IN is at a high level, the first clock signal provided by the first clock signal terminal CK is at a low level, and the second clock signal provided by the second clock signal terminal XCK is at a high level, maintaining, by the first node control module 1, the first node N1 at the low level of the second phase P2; providing, by the second node control module 2, a low level at the second node N2; and controlling, by the output control module 3, the scan signal output terminal OUT to output a high level; and in a fourth phase P4 when the input signal provided by the input signal terminal IN is at a high level, the first clock signal provided by the first clock signal terminal CK is at a high level, and the second clock signal provided by the second clock signal terminal XCK is at a low level, providing, by the first node control module 1, a high level at the first node N1; maintaining, by the second node control module 2, the second node N2 at the low level of the third phase P3; and controlling, by the output control module 3, the scan signal output terminal OUT to output a high level.

In an implementation, the low level of the first clock signal and the low level of the second clock signal are both equal to the low level of the low level signal, and the high level of the first clock signal and the high level of the second clock signal are both equal to the high level of the high level signal. In this way, the first clock signal and the second clock signal can be provided with a low level as well as a low level signal via a same signal line, and the first clock signal and the second clock signal can be provided with a high level as well as a low high signal via a same signal line. This can facilitate simplifying the driving method of the scan driving circuit including the above shift register and simplifying the structure of the display device.

In the following, the specific circuit structures of the first node control module 1, the second node control module 2 and the output control module 3 of the shift register will be illustrated with respect to FIGS. 3 and 4. It should be noted that the following descriptions are also applicable to the shift register and its driving method according to the embodiments of the present disclosure.

In an implementation, as shown in FIG. 3, the input unit 11 has a control terminal electrically connected to the first clock signal terminal CK, an input terminal electrically connected to the input signal terminal IN and an output terminal electrically connected to the third node N3. The protection unit 12 has a control terminal electrically connected to the third node N3, another control terminal electrically connected to the second clock signal terminal XCK, an output terminal electrically connected to the first node N1, an input terminal electrically connected to the fourth node N4, and another input terminal electrically connected to the second clock signal terminal XCK. The level at the third node N3 controls writing of the second clock signal into the fourth node N4, and the second clock signal controls writing of the level at the fourth node N4 into the first node N1.

The input unit 11 is specifically configured to: in the first phase P1, provide the input signal to the third node N3 based on the low level of the first clock signal, so that the third node N3 is at a low level; and in the third phase P3, provide the input signal to the third node N3 based on the low level of the first clock signal, so that the third node N3 is at a high level. In the second phase P2, the third node N3 is maintained at the low level of the first phase P1, and in the fourth phase P4, the third node N3 is maintained at the high level of the third phase P3.

The protection unit 12 is specifically configured to: in the first phase P1, write the second clock signal into the fourth node N4 based on the low level at the third node N3, so that the fourth node N4 is at a high level; in the second phase P2, write the second clock signal into the fourth node N4 based on the low level at the third node N3 so that the fourth node N4 is at a low level, and write the low level at the fourth node N4 into the first node N1 based on the low level of the second clock signal so that the first node N1 is at a low level; and in the fourth phase P4, write the high level at the fourth node N4 into the first node N1 based on the low level of the second clock signal. In the third phase P3, the protection unit 12 does not operate.

In addition, as shown in FIG. 3, the input unit 11 includes a first transistor M1, and the protection unit 12 includes a second transistor M2 and a third transistor M3. The first transistor M1 has a control terminal electrically connected to the first clock signal terminal CK, a first terminal electrically connected to the input signal terminal IN and a second terminal electrically connected to the third node N3. The second transistor M2 has a control terminal electrically connected to the third node N3, a first terminal electrically connected to the second clock signal terminal XCK and a second terminal electrically connected to the fourth node N4. The third transistor M3 has a control terminal electrically connected to the second clock signal terminal XCK, a first terminal electrically connected to the first node N1 and a second terminal electrically connected to the fourth node N4.

The first transistor M1 is configured to write the input signal into the third node N3 when it is switched on in response to the first clock signal. That is, the first transistor M1 is a transistor in the first node control module 1 for providing the input signal to the third node N3, i.e., a transistor to be protected from being broken down in the technical solution of the present disclosure. The second transistor M2 is configured to write the second clock signal into the fourth node N4 when it is switched on in response to the level at the third node N3. The third transistor M3 is configured to write the level at the fourth node N4 into the first node N1 or write the level at the first node N1 into the fourth node N4 when it is switched on in response to the second clock signal.

According to the embodiment of the present disclosure, each of the first transistor M1, the second transistor M2 and the third transistor M3 can be a PMOS transistor, which is switched on when its control terminal is at a low level and switched off when the control terminal is at a high level. Unless otherwise specified, the transistors mentioned in following embodiments of the present disclosure are all PMOS transistors.

In an implementation, as shown in FIG. 3, the first node control module 1 further includes a fourth transistor M4 having a control terminal electrically connected to the second node N2, a first terminal electrically connected to the high level signal terminal VGH and a second terminal electrically connected to the fourth node N4. The fourth transistor M4 is configured to write the high level signal into the fourth node N4 when it is switched on in response to the level at the second node N2.

In an implementation, as shown in FIG. 3, the first node control module 1 further includes a first capacitor C1 having a first electrode electrically connected to the high level signal terminal VGH and a second electrode electrically connected to the third node N3. The first capacitor C1 is configured to maintain the level at the third node N3, so that the shift register can operate more stably. For example, the first capacitor C1 has a capacitance of 60 F to 150 F, such as 100 F, so that the first capacitor C1 can not only maintain the level at the third node N3 but also avoid an excessively large area to be occupied by the first capacitor C1.

In an implementation, as shown in FIG. 3, the first node control module 1 further includes a second capacitor C2 having a first electrode electrically connected to the scan signal output terminal OUT and a second electrode electrically connected to the first node N1. The second capacitor C2 is configured to maintain the level at the first node N1, or to pull down the low level at the first node N1 through the coupling effect when a high level outputted by the scan signal output terminal OUT changes to a low level. For example, the second capacitor C2 has a capacitance of 60 F to 150 F, such as 100 F, so that the second capacitor C2 can maintain the level at the first node N1, avoid an excessively low level at the first node N1 due to a strong coupling effect of the second capacitor C2, and avoid an excessively large area to be occupied by the second capacitor C2.

It has been found that the smaller the width to length ratio of the transistor's channel is (the larger the length of the channel is and the smaller the width of the channel is), the better resistance to the voltage drop the transistor has. That is, the transistor can bear a larger voltage drop and is less likely to be broke down. The larger the width to length ratio of the transistor's channel is, the better its driving performance will be. In an embodiment of the present disclosure, the prior performance of the first transistor M1 is the resistance to voltage drop. Hence, in the embodiment of the present disclosure, the width to length ratio of the channel of the first transistor M1 is selected to be smaller than 1, in order to effectively increase its resistance to voltage drop and avoid its breakdown. For example, the width to length ratio of the channel of the first transistor M1 can be 4:8.

Further, with respect to the second transistor M2, the third transistor M3 and the fourth transistor M4, their driving performances are the major concern in an embodiment of the present disclosure. Hence, in the embodiment of the present disclosure, the width to length ratio of the channel of each of the second transistor M2, the third transistor M3 and the fourth transistor M4 is selected to be larger than 1. However, if the width to length ratio of the channel of a transistor is too large, the width of the channel of the transistor M11 will be too large when the length of the channels is fixed, leading to a large size of the shift register, which is not conductive to achieving a narrow frame for the display device. If the width of the channels is fixed, the length of the channel of the transistor will be too small, and thus the transistor is likely to be broken down. Therefore, according to an embodiment of the present disclosure, the width to length ratio of the channel of each of the second transistor M2, the third transistor M3 and the fourth transistor M4 is selected to be in a range of 1 to 5, e.g., 8:4.

In an implementation, as shown in FIG. 3, the second node control module 2 includes a fifth transistor M5, a sixth transistor M6 and a third capacitor C3. The fifth transistor M5 has a control terminal electrically connected to the third node N3, a first terminal electrically connected to the first clock signal terminal CK and a second terminal electrically connected to the second node N2. The sixth transistor M6 has a control terminal electrically connected to the first clock signal terminal CK, a first terminal electrically connected to the low level signal terminal VGL and a second terminal electrically connected to the second node N2. The third capacitor C3 has a first electrode electrically connected to the high level signal terminal VGH and a second electrode electrically connected to the second node N2.

The fifth transistor M5 is configured to write the first clock signal into the second node N2 when it is switched on in response to the level at the third node N3. The sixth transistor M6 is configured to write the low level signal into the second node N2 when it is switched on in response to the first clock signal. The third capacitor C3 is configured to maintain the level at the second node N2.

Similarly, the width to length ratios of the channels of the fifth transistor M5 and the sixth transistor M6 can be selected to be larger than 1 in the embodiment of the present disclosure, and preferably the width to length ratios of the channels of the fifth transistor M5 and the sixth transistor M6 can be selected to be in a range from 1 to 5, e.g., 8:4. The third capacitor C3 has a capacitance of 60 F to 150 F, e.g., 100 F.

In an implementation, the output control module 3 includes a seventh transistor M7 and an eighth transistor M8. The seventh transistor M7 has a control terminal electrically connected to the second node N2, a first terminal electrically connected to the high level signal terminal VGH and a second terminal electrically connected to the scan signal output terminal OUT. The eighth transistor M8 has a control terminal electrically connected to the first node N1, a first terminal electrically connected to the second clock signal terminal XCK and a second terminal electrically connected to the scan signal output terminal OUT.

The seventh transistor M7 is configured to provide the high level signal to the scan signal output terminal OUT when it is switched on in response to the level at the second node N2, so that the scan signal output terminal OUT outputs a high level. The eighth transistor M8 is configured provide the second clock signal to the scan signal output terminal OUT when it is switched on in response to the level at the first node N1, so that the scan signal output terminal OUT outputs the second clock signal.

Similarly, the width to length ratios of the channels of the seventh transistor M7 and the eighth transistor M8 are selected to larger than 1 in the embodiment of the present disclosure, and preferably the width to length ratios of the channels of the seventh transistor M7 and the eighth transistor M8 can be selected to be in a range from 1 to 5, e.g., 8:4.

By taking a shift register having a circuit structure shown in FIG. 3 as an example, the specific operating states of respective transistors and capacitors in respective phases of the shift register will be explained in detail as below with reference to the operating sequence diagram of the shift register as shown in FIG. 4.

In the first phase P1, the input signal provided by the input signal terminal IN is at a low level, the first clock signal provided by the first clock signal terminal CK is at a low level, and the second clock signal provided by the second clock signal terminal XCK is at a high level. The first transistor M1 and the sixth transistor M6 controlled by the first clock signal are both switched on. The input signal arrives at the third node N3 through the first transistor M1. The third node N3 is at a low level. The second transistor M2 and the fifth transistor M5 are both switched on. The second clock signal arrives at the fourth node N4 through the second transistor M2. The fourth node N4 is at a high level. The first clock signal arrives at the second node N2 through the fifth transistor M5. The second node N2 is at a low level. The fourth transistor M4 is switched on. The high level signal arrives at the fourth node N4 through the fourth transistor M4, so as to further maintain the fourth node N4 at a high level. The third transistor M3 controlled by the second clock signal is switched off. The second capacitor C2 maintains the first node N1 at the high level of the previous phase. The high level at the first node N1 switches the transistor M8 off. The low level at the second node N2 switches the seventh transistor M7 on. The high level signal arrives at the scan signal output terminal OUT through the seventh transistor M7. The scan signal output terminal OUT outputs a high level.

In the second phase P2, the input signal provided by the input signal terminal IN is at a high level, the first clock signal provided by the first clock signal terminal CK is at a high level, and the second clock signal provided by the second clock signal terminal XCK is at a low level. The first transistor M1 and the sixth transistor M6 controlled by the first clock signal are both switched off. The first capacitor C1 maintains the third node N3 at the low level of the first phase P1. The second transistor M2 and the fifth transistor M5 are both switched on. The second clock signal arrives at the fourth node N4 through the second transistor M2. The fourth node N4 is at a low level. The first clock signal arrives at the second node N2 through the fifth transistor M5. The second node N2 is at a high level. The fourth transistor M4 is switched off. The third transistor M3 controlled by the second clock signal is switched on. The low level at the fourth node N4 arrives at the first node N1 through the third transistor M3. The first node N1 is at a low level. The low level at the first node N1 switches the eighth transistor M8 on. The high level at the second node N2 switches the seventh transistor M7 off. The second clock signal arrives at the scan signal output terminal OUT through the eighth transistor M8. The scan signal output terminal OUT outputs a low level. Under the coupling effect of the second capacitor C2, the level at the first node N1 becomes lower.

In the third phase P3, the input signal provided by the input signal terminal IN is at a high level, the first clock signal provided by the first clock signal terminal CK is at a low level, and the second clock signal provided by the second clock signal terminal XCK is at a high level. The first transistor M1 and the sixth transistor M6 controlled by the first clock signal are both switched on. The input signal arrives at the third node N3 through the first transistor M1. The third node N3 is at a high level. The second transistor M2 and the fifth transistor M5 are both switched off. The low level signal arrives at the second node through the sixth transistor M6. The second node N2 is at a low level. The fourth transistor M4 is switched on. The high level signal arrives at the fourth node N4 through the fourth transistor M4. The fourth node N4 is at a high level. The third transistor M3 controlled by the second clock signal is switched off. The second capacitor C2 maintains the first node N1 at the low level of the second phase P2. The low level at the first node N1 switches the transistor M8 on. The low level at the second node N2 switches the seventh transistor M7 on. The second clock signal arrives at the scan signal output terminal OUT through the eighth transistor M8, and the high level signal arrives at the scan signal output terminal OUT through the seventh transistor M7. The scan signal output terminal OUT outputs a high level.

In the fourth phase P4, the input signal provided by the input signal terminal IN is at a high level, the first clock signal provided by the first clock signal terminal CK is at a high level, and the second clock signal provided by the second clock signal terminal XCK is at a low level. The first transistor M1 and the sixth transistor M6 controlled by the first clock signal are both switched off. The first capacitor C1 maintains the third node N3 at the high level of the third phase P3. The second transistor M2 and the fifth transistor M5 are both switched off. The third capacitor C3 maintains the second node N2 at the low level of the second phase P2. The fourth transistor M4 is switched on. The high level signal arrives at the fourth node N4 through the fourth transistor M4. The transistor M4 is at a high level. The third transistor M3 controlled by the second clock signal is switched on. The high level at the fourth node N4 arrives at the first node N1 through the third transistor M3. The first node N1 is at a high level. The high level at the first node N1 switches the eighth transistor M8 off. The low level at the second node N2 switches the seventh transistor M7 on. The high level signal arrives at the scan signal output terminal OUT through the seventh transistor M7. The scan signal output terminal OUT outputs a high level.

Figure 5:
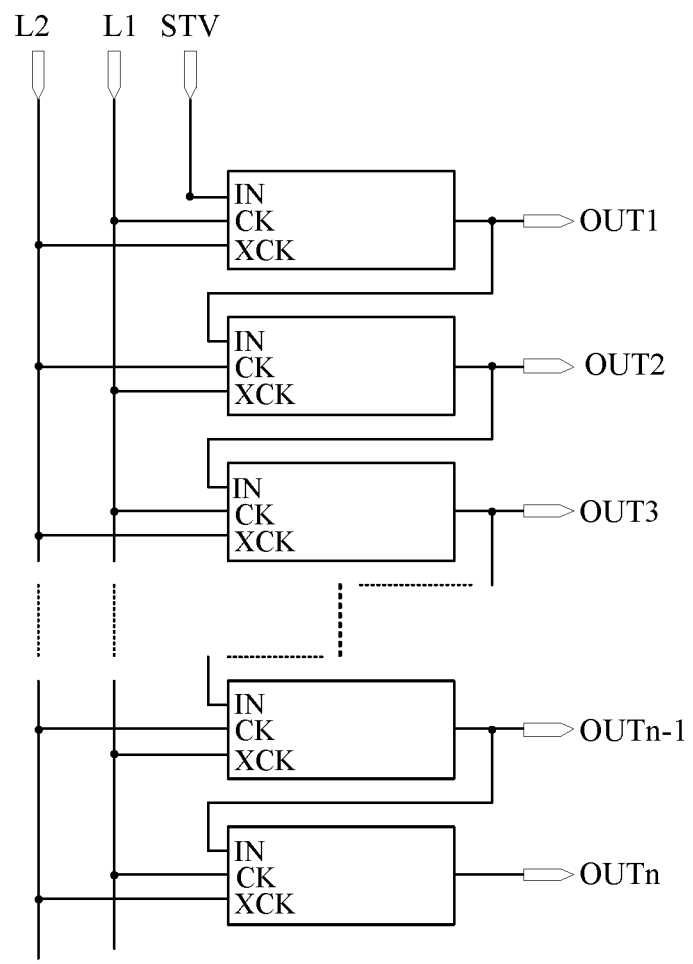
FIG. 5 is a structural schematic diagram of a scan driving circuit according to another embodiment of the present disclosure.
Figure 6:
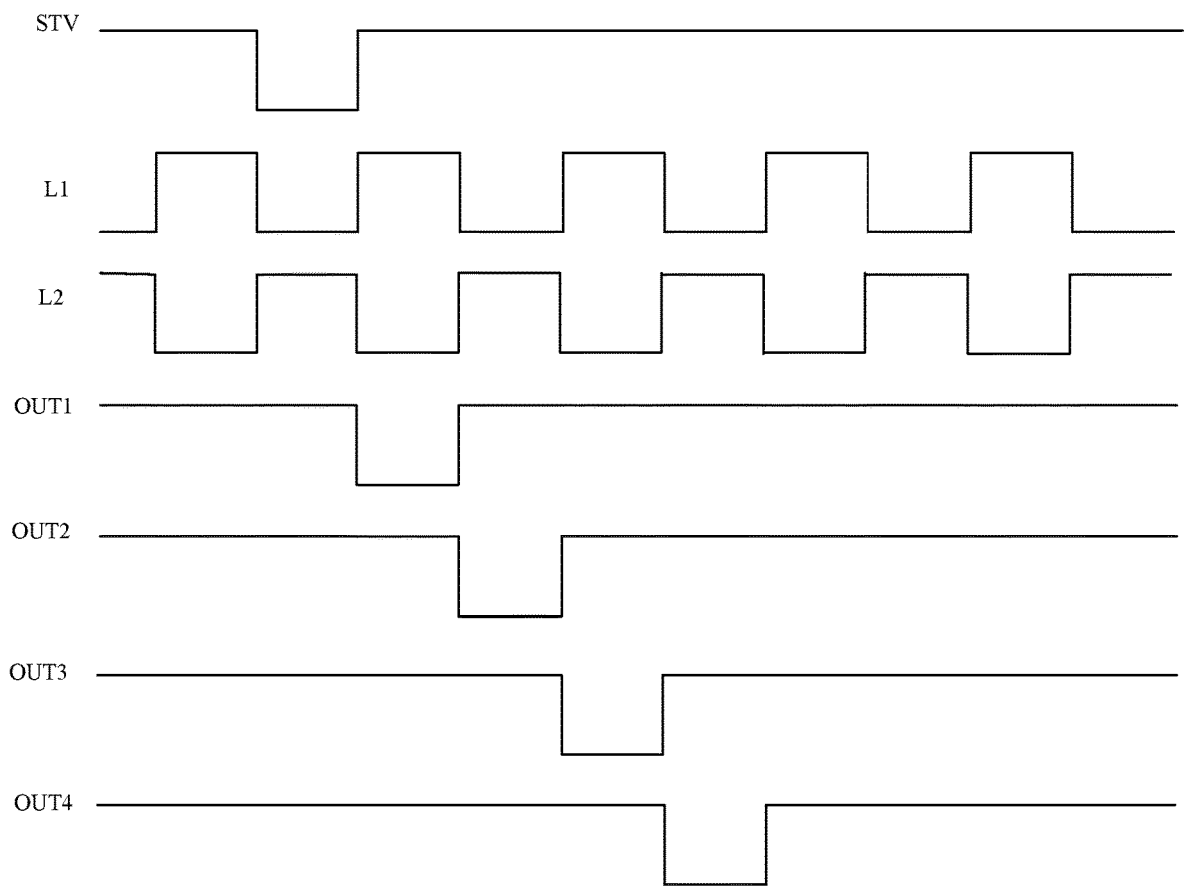
FIG. 6 is an operating sequence diagram of the scan driving circuit according to the embodiment of the present disclosure as shown in FIG. 5.

The embodiments of the present disclosure further provide a scan driving circuit, as shown in FIGS. 5 and 6. FIG. 5 is a structural schematic diagram of a scan driving circuit according to an embodiment of the present disclosure, and FIG. 6 is an operating sequence diagram of the scan driving circuit according to the embodiment of the present disclosure shown in FIG. 5. The scan driving circuit includes a first signal line L1, a second signal line L2, and a plurality of cascaded shift registers. A shift register at each stage can be any shift register mentioned above.

The first clock signal terminal CK of a shift register at each odd-numbered stage and the second clock signal terminal XCK of a shift register at each even-numbered stage are both electrically connected to the first signal line L1.

The second clock signal terminal XCK of a shift register at each odd-numbered stage and the first clock signal terminal CK of a shift register at each even-numbered stage are both electrically connected to the second signal line L2.

In an implementation, as shown in FIG. 5, the input signal terminal IN of a shift register at a $n^{th}$ stage of the plurality of cascaded shift registers is electrically connected to the scan signal output terminal OUTn−1 of a shift register at a $(n-1)^{th}$ stage of the plurality of cascaded shift registers, where n is 2, 3, 4, . . . , N, and N is a number of the plurality of cascaded shift registers in the scan driving circuit.

There are various connection manners for the input signal terminal IN of the shift register at the $1^{st}$ stage. In a first manner, as shown in FIG. 5, the scan driving circuit can further include an input signal line STV, and the input signal terminal IN of the shift register at the $1^{st}$ stage is electrically connected to the input signal line STV. In a second manner, the scan driving circuit can further include a front-loading scan unit, which has a same structure as the shift register, and the front-loading scan unit has a scan signal output terminal electrically connected to the input signal terminal IN of the shift register at the $1^{st}$ stage. In a third manner, the input signal terminal IN of the shift register at the $1^{st}$ stage is electrically connected to the scan signal output terminal OUT of the shift register at the $N^{th}$ stage. As shown in FIG. 5, when the input signal terminal IN of the shift register at the $1^{st}$ stage is electrically connected to the input signal line STV, the scan driving circuit can have a relatively simple circuit structure and its driving method is also relatively simple.

Figure 7:
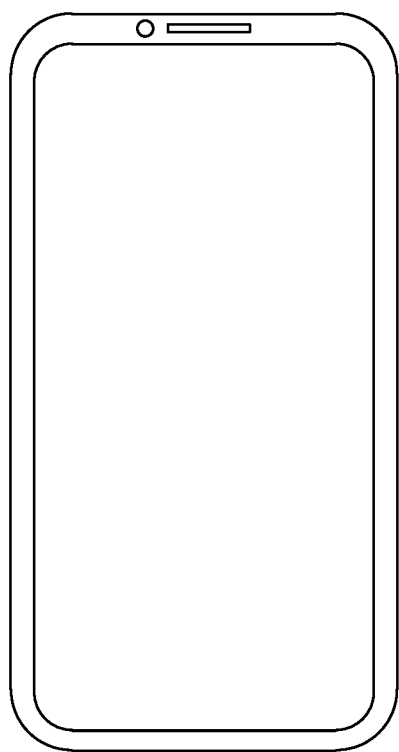
FIG. 7 is a structural schematic diagram of a display device according to an embodiment of the present disclosure.

In addition, the embodiments of the present disclosure further provide a display device as shown in FIG. 7. FIG. 7 is a structural schematic diagram of a display device according to an embodiment of the present disclosure. The display device includes the scan driving circuit as mentioned above. The display device according to the embodiments of the present disclosure can be any product or component having display function such as a smart phone, a wearable smart watch, intelligent glasses, a Tablet PC, a TV, a monitor, a laptop, a digital photo frame, a navigator, a car monitor, an e-book, and the like. The display panel and the display device provided in the embodiments of the present disclosure can be either flexible or non-flexible, which is not limited herein.

In an implementation, the display device can be an organic light-emitting display device, which can include an organic light-emitting display panel. The organic light-emitting display panel includes a plurality of pixel circuits and a plurality of Organic Light-Emitting Diodes (OLEDs). Each organic light-emitting diode has an anode electrically connected to a corresponding pixel circuit. The plurality of light-emitting diodes includes a light-emitting diode for emitting red light, a light-emitting diode for emitting green light, and a light-emitting diode for emitting blue light. In addition, the organic light-emitting display panel further includes an encapsulation layer for covering the plurality of organic light-emitting diodes.

The embodiments of the present disclosure provide a shift register, a method for driving the shift register, a scan driving circuit, and a display device. The shift register includes a first node control module 1, a second node control module 2 and an output control module 3. The first node control module 1 is configured to control a level at the first node N1 based on respective levels of the input signal, the first clock signal, the second clock signal, the high level signal and the second node N2. The second node control module 2 is configured to control a level at the second node N2 based on the first clock signal and the low level signal. The output control module 3 is configured to control the scan signal output terminal OUT to output a high level or a low level based on the level at the first node N1 and the level at the second node N3. The first node control module 1 includes an input unit 11 configured to write the input signal into the third node N3, and a protection unit 12 configured to control a level at the fourth node N4 based on a level at the third node N3 and control writing of the level at the fourth node N4 into the first node N1 based on the second clock signal. That is, there is no direct signal transmission between the third node N3 and the first node N1. The third node N3 and the first node N1 mutually influence in such manner that the level at the third node N3 controls the level at the fourth node N4, which the fourth node N4 is electrically connected to the first node N1. Thus, when the level at the first node N1 is very low, it will not result in a such low level at the third node N3, so as to avoid an excessively high voltage drop between the first and second terminals of the transistor for providing the third node N3 with the input signal in the first node control module 1. In this way, the transistor is effectively protected from being broken down.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A scan driving circuit, comprising a plurality of cascaded shift registers,
wherein a shift register at each stage of the plurality of cascaded shift registers comprises:
a first node control module;
a second node control module; and
an output control module, wherein
the first node control module is electrically connected to an input signal terminal, a first clock signal terminal, a second clock signal terminal, a high level signal terminal, a first node, a second node and a third node, and configured to control a level at the first node based on an input signal, a first clock signal, a second clock signal, a high level signal and a level at the second node, wherein the first node control module comprises an input unit configured to write the input signal into the third node and a protection unit configured to control a level at a fourth node based on a level at the third node and control writing of the level at the fourth node into the first node based on the second clock signal,
the second node control module is electrically connected to the first clock signal terminal, a low level signal terminal and the second node, and configured to control the level at the second node based on the first clock signal and the low level signal, and
the output control module is electrically connected to the first node, the second node, the high level signal terminal, the second clock signal terminal and a scan signal output terminal, and configured to control the scan signal output terminal to output a high level or a low level based on the level at the first node and the level at the second node.

2. The scan driving circuit according to claim 1, wherein
the input unit has a control terminal electrically connected to the first clock signal terminal, an input terminal electrically connected to the input signal terminal and an output terminal electrically connected to the third node, and
the protection unit has a control terminal electrically connected to the third node, another control terminal electrically connected to the second clock signal terminal, an output terminal electrically connected to the first node, an input terminal electrically connected to the fourth node, and another input terminal electrically connected to the second clock signal terminal, wherein the level at the third node controls writing of the second clock signal into the fourth node, and the second clock signal controls writing of the level at the fourth node into the first node.

3. The scan driving circuit according to claim 2, wherein the input unit comprises a first transistor, and the protection unit comprises a second transistor and a third transistor, wherein
the first transistor has a control terminal electrically connected to the first clock signal terminal, a first terminal electrically connected to the input signal terminal and a second terminal electrically connected to the third node,
the second transistor has a control terminal electrically connected to the third node, a first terminal electrically connected to the second clock signal terminal and a second terminal electrically connected to the fourth node, and the third transistor has a control terminal electrically connected to the second clock signal terminal, a first terminal electrically connected to the first node and a second terminal electrically connected to the fourth node.

4. The scan driving circuit according to claim 3, wherein the first node control module further comprises a fourth transistor having a control terminal electrically connected to the second node, a first terminal electrically connected to the high level signal terminal and a second terminal electrically connected to the fourth node.

5. The scan driving circuit according to claim 3, wherein the first node control module further comprises a first capacitor having a first electrode electrically connected to the high level signal terminal and a second electrode electrically connected to the third node.

6. The scan driving circuit according to claim 3, wherein the first node control module further comprises a second capacitor having a first electrode electrically connected to the scan signal output terminal and a second electrode electrically connected to the first node.

7. The scan driving circuit according to claim 3, wherein the first transistor has a channel with a width to length ratio of 4:8.

8. The scan driving circuit according to claim 1, wherein the second node control module comprises a fifth transistor, a sixth transistor and a third capacitor, wherein the fifth transistor has a control terminal electrically connected to the third node, a first terminal electrically connected to the first clock signal terminal and a second terminal electrically connected to the second node, the sixth transistor has a control terminal electrically connected to the first clock signal terminal, a first terminal electrically connected to the low level signal terminal and a second terminal electrically connected to the second node, and the third capacitor has a first electrode electrically connected to the high level signal terminal and a second electrode electrically connected to the second node.

9. The scan driving circuit according to claim 1, wherein the output control module comprises a seventh transistor and an eighth transistor, wherein the seventh transistor has a control terminal electrically connected to the second node, a first terminal electrically connected to the high level signal terminal and a second terminal electrically connected to the scan signal output terminal, and the eighth transistor has a control terminal electrically connected to the first node, a first terminal electrically connected to the second clock signal terminal and a second terminal electrically connected to the scan signal output terminal.

10. The scan driving circuit according to claim 1, further comprising a first signal line, and a second signal line, wherein each first clock signal terminal of the shift register at each odd-numbered stage of the plurality of cascaded shift registers and the second clock signal terminal of the shift register at each even-numbered stage of the plurality of cascaded shift registers are both electrically connected to the first signal line, and the second clock signal terminal of the shift register at each odd-numbered stage of the plurality of cascaded shift registers and the first clock signal terminal of the shift register at each even-numbered stage of the plurality of cascaded shift registers are both electrically connected to the second signal line.

11. The scan driving circuit according to claim 10, wherein the input signal terminal of a shift register at an $n^{th}$ stage of the plurality of cascaded shift registers is electrically connected to the scan signal output terminal of a shift register at an $(n-1)^{th}$ stage of the plurality of cascaded shift registers, wherein n is 2, 3, 4, . . . , N, and N is a number of the plurality of cascaded shift registers in the scan driving circuit.

12. A display device, comprising a scan driving circuit, the scan driving circuit comprising a plurality of cascaded shift registers, wherein a shift register at each stage of the plurality of cascaded shift registers, comprising comprises:
a first node control module;
a second node control module; and
an output control module, wherein
the first node control module is electrically connected to an input signal terminal, a first clock signal terminal, a second clock signal terminal, a high level signal terminal, a first node, a second node and a third node, and configured to control a level at the first node based on respective levels of an input signal, a first clock signal, a second clock signal, a high level signal and the second node, wherein the first node control module comprises an input unit configured to write the input signal into the third node and a protection unit configured to control a level at a fourth node based on a level at the third node and control writing of the level at the fourth node into the first node based on the second clock signal, the second node control module is electrically connected to the first clock signal terminal, a low level signal terminal and the second node, and configured to control a the level at the second node based on the first clock signal and the low level signal, and the output control module is electrically connected to the first node, the second node, the high level signal terminal, the second clock signal terminal and a scan signal output terminal, and configured to control the scan signal output terminal to output a high level or a low level based on the level at the first node and the level at the second node.

13. A method for driving a shift register of a scan driving circuit, the scan driving circuit comprising a plurality of cascaded shift registers, wherein a shift register at each stage of the plurality of cascaded shift registers, comprising comprises:
a first node control module;
a second node control module; and
an output control module, wherein
the first node control module is electrically connected to an input signal terminal, a first clock signal terminal, a second clock signal terminal, a high level signal terminal, a first node, a second node and a third node, and configured to control a level at the first node based on respective levels of an input signal, a first clock signal, a second clock signal, a high level signal and the second node, wherein the first node control module comprises an input unit configured to write the input signal into the third node and a protection unit configured to control a level at a fourth node based on a level at the third node and control writing of the level at the fourth node into the first node based on the second clock signal, the second node control module is electrically connected to the first clock signal terminal, a low level signal terminal and the second node, and configured to control a the level at the second node based on the first clock signal and the low level signal, and the output control module is electrically connected to the first node, the second node, the high level signal terminal, the second clock signal terminal and a scan signal output terminal, and configured to control the scan signal output terminal to output a high level or a low level based on the level at the first node and the level at the second node, wherein the method comprises:

maintaining, by the first node control module, the first node at a high level of a previous phase; providing, by the second node control module, a low level at the second node; and controlling, by the output control module, the scan signal output terminal to output a high level, in a first phase when the input signal provided by the input signal terminal is at a low level, the first clock signal provided by the first clock signal terminal is at a low level and the second clock signal provided by the second clock signal terminal is at a high level;

providing, by the first node control module, a low level at the first node; providing, by the second node control module, a high level at the second node; and controlling, by the output control module, the scan signal output terminal to output a low level, in a second phase when the input signal provided by the input signal terminal is at a high level, the first clock signal provided by the first clock signal terminal is at a high level, and the second clock signal provided by the second clock signal terminal is at a low level;

maintaining, by the first node control module, the first node at the low level of the second phase; providing, by the second node control module, a low level at the second node; and controlling, by the output control module, the scan signal output terminal to output a high level, in a third phase when the input signal provided by the input signal terminal is at a high level, the first clock signal provided by the first clock signal terminal is at a low level, and the second clock signal provided by the second clock signal terminal is at a high level; and providing, by the first node control module, a high level at the first node; maintaining, by the second node control module, the second node at the low level of the third phase; and controlling, by the output control module, the scan signal output terminal to output a high level, in a fourth phase when the input signal provided by the input signal terminal is at a high level, the first clock signal provided by the first clock signal terminal is at a high level, and the second clock signal provided by the second clock signal terminal is at a low level.

14. The method according to claim 13, wherein the low level of the first clock signal and the low level of the second clock signal are both equal to the low level of the low level signal, and the high level of the first clock signal and the high level of the second clock signal are both equal to the high level of the high level signal.

15. The method according to claim 13, wherein the input unit has a control terminal electrically connected to the first clock signal terminal, an input terminal electrically connected to the input signal terminal and an output terminal electrically connected to the third node, and the protection unit has a control terminal electrically connected to the third node, another control terminal electrically connected to the second clock signal terminal, an output terminal electrically connected to the first node, an input terminal electrically connected to the fourth node, and another input terminal electrically connected to the second clock signal terminal, wherein the level at the third node controls writing of the second clock signal into the fourth node, and the second clock signal controls writing of the level at the fourth node into the first node.

16. The method according to claim 15, wherein the input unit comprises a first transistor, and the protection unit comprises a second transistor and a third transistor, wherein the first transistor has a control terminal electrically connected to the first clock signal terminal, a first terminal electrically connected to the input signal terminal and a second terminal electrically connected to the third node, the second transistor has a control terminal electrically connected to the third node, a first terminal electrically connected to the second clock signal terminal and a second terminal electrically connected to the fourth node, and the third transistor has a control terminal electrically connected to the second clock signal terminal, a first terminal electrically connected to the first node and a second terminal electrically connected to the fourth node.

17. The method according to claim 16, wherein the first node control module further comprises a fourth transistor having a control terminal electrically connected to the second node, a first terminal electrically connected to the high level signal terminal and a second terminal electrically connected to the fourth node.

18. The method according to claim 16, wherein the first node control module further comprises a first capacitor having a first electrode electrically connected to the high level signal terminal and a second electrode electrically connected to the third node.

19. The method according to claim 13, wherein the second node control module comprises a fifth transistor, a sixth transistor and a third capacitor, wherein the fifth transistor has a control terminal electrically connected to the third node, a first terminal electrically connected to the first clock signal terminal and a second terminal electrically connected to the second node, the sixth transistor has a control terminal electrically connected to the first clock signal terminal, a first terminal electrically connected to the low level signal terminal and a second terminal electrically connected to the second node, and the third capacitor has a first electrode electrically connected to the high level signal terminal and a second electrode electrically connected to the second node.

20. The method according to claim 13, wherein the output control module comprises a seventh transistor and an eighth transistor, wherein the seventh transistor has a control terminal electrically connected to the second node, a first terminal electrically connected to the high level signal terminal and a second terminal electrically connected to the scan signal output terminal, and the eighth transistor has a control terminal electrically connected to the first node, a first terminal electrically connected to the second clock signal terminal and a second terminal electrically connected to the scan signal output terminal.

* * * * *